US006864552B2

(12) United States Patent
Razeghi

(10) Patent No.: US 6,864,552 B2
(45) Date of Patent: Mar. 8, 2005

(54) FOCAL PLANE ARRAYS IN TYPE II-SUPERLATTICES

(75) Inventor: Manijeh Razeghi, Wilmette, IL (US)

(73) Assignee: MP Technologies, LLC, Wilmette, IL (US)

( * ) Notice: Subject to any disclaimer, the term of this patent is extended or adjusted under 35 U.S.C. 154(b) by 0 days.

(21) Appl. No.: 10/347,650

(22) Filed: Jan. 21, 2003

(65) Prior Publication Data

US 2004/0142504 A1 Jul. 22, 2004

(51) Int. Cl.[7] .......................... H01L 21/44; H01L 33/00; H01L 31/0328; H01L 27/14; H01L 31/06
(52) U.S. Cl. ...................... 257/432; 257/103; 257/184; 257/431; 257/461
(58) Field of Search .................. 438/108, 612, 438/613, 608; 257/80, 84, 103, 184, 222, 431, 432, 461; 250/370.12, 370.14

(56) References Cited

U.S. PATENT DOCUMENTS 5,539,206 A * 7/1996 Schimert .................. 250/338.4
2002/0195597 A1 * 12/2002 Choa .......................... 257/14

* cited by examiner

Primary Examiner—Matthew Smith
Assistant Examiner—Chuong Anh Luu
(74) Attorney, Agent, or Firm—Welsh & Katz, Ltd.

(57) ABSTRACT

The subject invention comprises a type-II superlattice photon detector and focal planes array and method for making. The device may be either a binary or tertiary system with a type-II band alignment.

7 Claims, 3 Drawing Sheets

Figure 2:
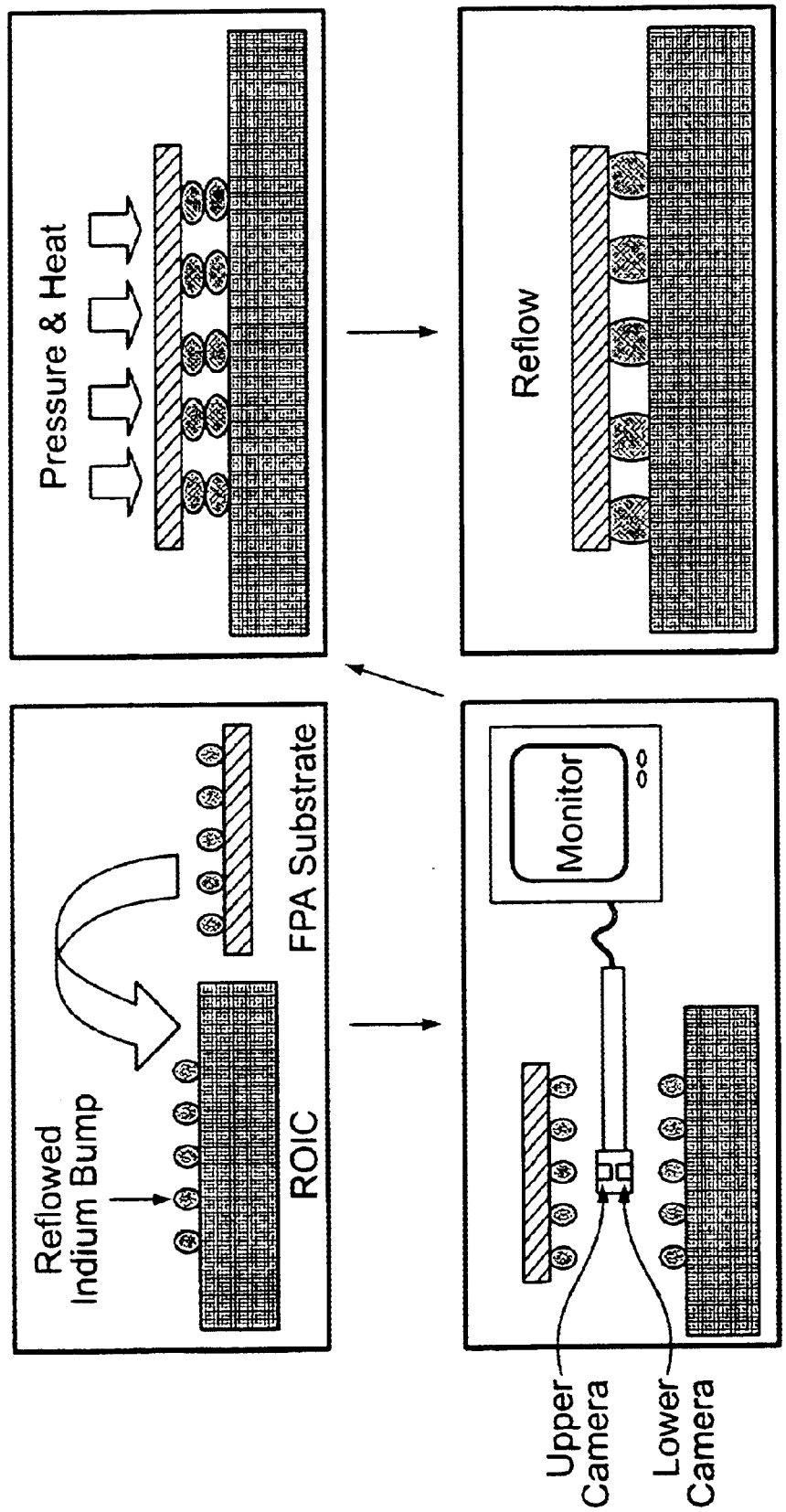

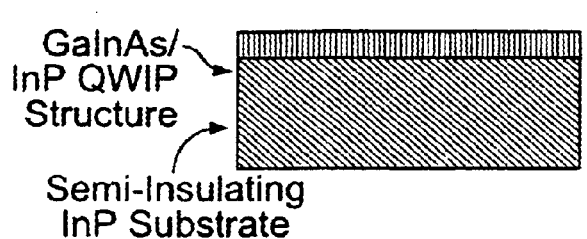
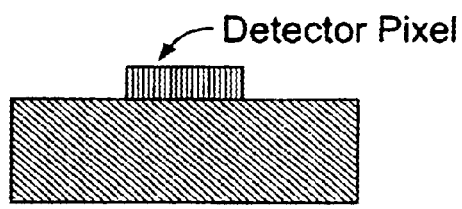
FIG. 1A  FIG. 1B
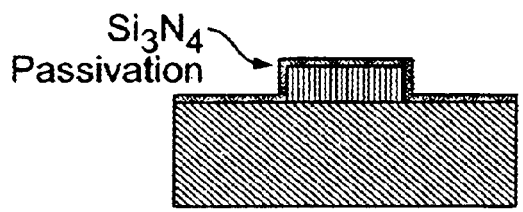
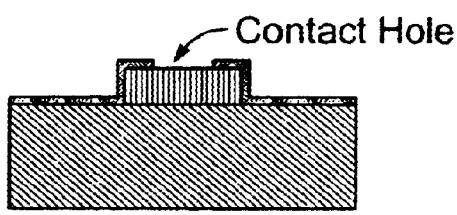
FIG. 1C  FIG. 1D
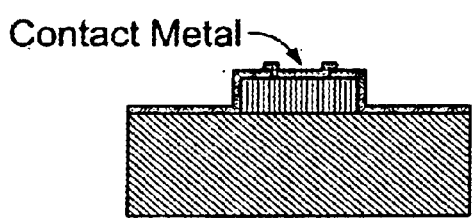
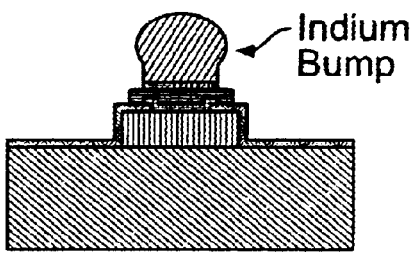
FIG. 1E  FIG. 1F
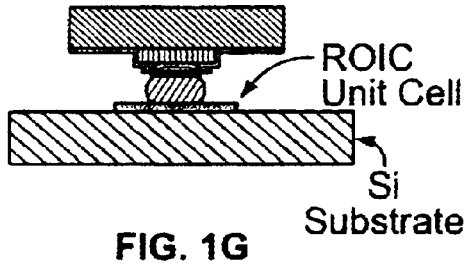
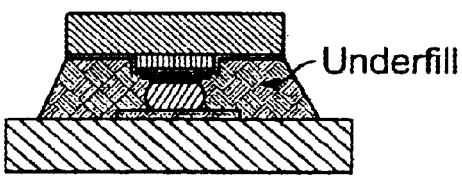
FIG. 1G  FIG. 1H
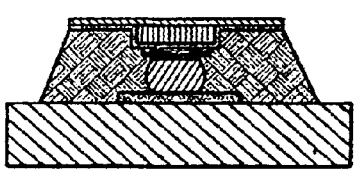
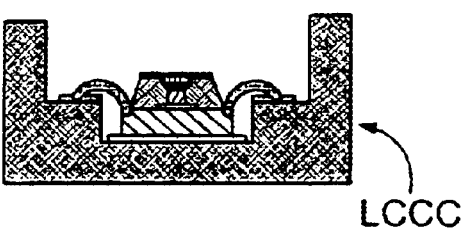
FIG. 1I  FIG. 1J

FOCAL PLANE ARRAYS IN TYPE II-SUPERLATTICES

BACKGROUND OF INVENTION

This application relates to Quantum Well Infrared Focal Plane Arrays, and more particularly, to Type-II Superlattice Focal Plane Arrays.

Infrared focal plane arrays (FPA) have found many applications that can be divided into two major categories: military and commercial. Military applications include night vision, target acquisition and tracking, reconnaissance, fire control, etc. Commercial applications include industrial, environmental, civil, and medical. Both infrared thermal detectors and photon detectors can be used to fabricate FPAs.

As is known in the art, QWIP FPAs are composed of arrays of detector structures, wherein each detector structure produces a signal that is transmitted through a conductor bump to an external Read Out Integrated Circuit (ROIC) unit cell. The outputs of the plurality of ROIC unit cells associated with each detector in the array produce an integrated representation of the signal from the detector. To produce this output signal, a fixed bias is applied to the detector and the detector photocurrent resulting from the bias and the incident radiation is integrated. This integration function is performed by an integration charge well (integration capacitor) that is disposed within each individual ROIC unit cell. The combined integrated outputs of the plurality of ROIC unit cells in the array produce an image corresponding to the received infrared radiation.

Most quantum well and superlattice photon detectors are grown by state-of-the-art MOCVD and MBE techniques which allows a high material uniformity across a larger wafer. Higher material uniformity translates to FPAs with a higher detector array uniformity, which is very important for lower NEΔT (noise equivalent temperature difference). Due to its internal detection mechanism: absorption of photons by electrons, a quantum well photon detector has very fast response time (up to 30 GHz) compared to thermal and other infrared detectors. Fast response time FPAs are highly favored by military applications such as target tracking. With quantum well structure engineering, it is not difficult to tune the detection wavelength of quantum well photon detectors and, by stacking quantum well structures, it is also not difficult to achieve multi-band detection.

Compared with thermal detectors, such as microbolometers, pyroelectric detector, quantum well photon detectors generally have higher detectivity, which translates to a FPA with much lower NEΔT.

Type-II superlattice detectors (i.e. quantum well photon detectors with type-II band alignment) have shown high room temperature detectivity and such quantum well detectors can be used to build future uncooled FPAs with fast response. So far, most uncooled FPAs are based on slow thermal detectors, such as microbolometers.

With the advances of III-V semiconductor material growth such as multiquantum well (MQW) structures on a Silicon substrate, a quantum well photon detector can be grown on a Si wafer, thereby permitting a monolithic infrared FPA integrated with a Si based ROIC. With a monolithic scheme, low cost FPA is expected due to the elimination of the complicated hybridization process, which is currently necessary in the hybrid infrared FPA fabrication.

The compositions of lattice-matched semiconductor materials of the quantum well layers can be adjusted to cover a wide range of wavelengths for infrared detection and sensing. Quantum-well structures can achieve, among other advantages, high uniformity, a low noise-equivalent temperature difference, large format arrays, high radiation hardness, and low cost.

Each MQW structure has multiple quantum wells which are artificially fabricated by alternatively placing thin layers of two different, high-bandgap semiconductor materials adjacent to one another to form a stack, as known in the art. The bandgap discontinuity of the two materials creates quantized subbands in the potential wells associated with conduction bands or valence bands.

The band alignment of any heterojunction can be categorized as type-I, type-II staggered or type-II misaligned. In type-I heterojunctions, one material has lower energy for electrons and the holes and therefore both carriers are confined in that layer. In type-II heterojunctions, however, the electrons are confined in one material and the holes in the other. In the extreme case, which is called type-II misaligned, the energy of the conduction band of one material is less than the valence band of the other one.

Type-II superlattice detectors are based on interband optical transitions and hence they can operate at much higher temperatures. Moreover, theoretical calculations and experimental results show that $InAs/Ga_{1-x}In_xSb$ type-II superlattices have a similar absorption coefficient to HgCdTe, and therefore type-II superlattice detectors with high quantum efficiencies are possible.

The special band alignment of the type-II heterojunctions provides three important features that may be used in many devices to improve the overall performance of the device.

The first feature is that a superlattice with the type-II band structure can have a lower effective bandgap than the bandgap of each layer. This is an important issue for the applications in the mid and long infrared wavelength range, since one can generate an artificial material (the superlattice) with a constant lattice parameter but different bandgaps. Very successful detectors and lasers have been implemented in the 2–15 $\mu$m wavelength range and InAs/GaInSb superlattices lattice-matched to GaSb substrates.

The second feature is the spatial separation of the electrons and holes in a type-II heterojunction. This phenomenon is a unique feature of this band alignment and is due to the separation of the electron and hole potential wells. As a result of such spatial separation, a huge internal electrical field exists in the junction without any doping or hydrostaticpressure. High performance optical modulators have been implemented based on this feature.

The third feature is the zener-type tunneling in a type-II misaligned heterojunction. Electrons can easily tunnel from the conduction band of one layer to the valence band of the other layer, since the energy of the conduction band of the former layer is less than the energy of the valence band of the later layer. Unlike a zener tunneling junction which requires heavily doped layers, no doping is necessary for such a junction. Therefore, even a semimetal layer can be implemented with very high electron and hole mobilities since the impurity and ion scattering are very low. This feature of type-II heterojunctions has been successfully used for resonant tunneling diodes (RTDs) and recently for the implementation of type-II quantum cascade lasers.

SUMMARY OF THE INVENTION

The subject invention comprises a type-II superlattice photon detector and focal planes array and method for making. The device may be either a binary or tertiary system with a type-II band alignment. More particularly, the invention comprises a method of preparing an infrared detector having the steps of: growing a type-II superlattice structure on a substrate, fabricating detector pixels, passivating the detector pixels with a passivation layer, patterning and etching the passivation layer, preparing metallic contacts, fabricate indium bumps, flip-chip bonding the substrate with a Si-based ROIC, and underfilling, to create an infrared detector based on a type-II superlattice. The invention also comprises an infrared detector Focal Plane Array device, which is composed of a binary type-II superlattice structure on a substrate, having a detector pixel, an indium bump contacting the detector pixel on one side, and contacting a ROIC unit cell on the opposite side, the ROIC unit is to the detector substrate, with underfill between the substrate and the detector substrate to form a FPA hybrid, and the FPA hybrid is connected to a ceramic chip carrier.

CONCISE DESCRIPTION OF THE DRAWINGS

FIGS. 1(a)–1(j) depicts a schematic of a direct hybrid infrared FPA fabrication process.

FIG. 2 is a flip chip bonding process in infrared FPA fabrication.

Figure 3A:
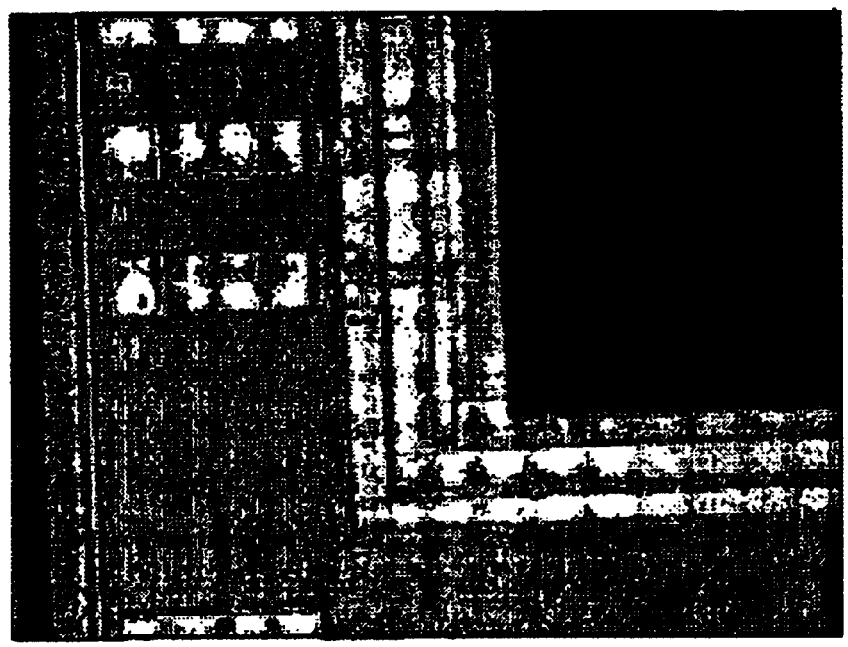
Figure 3B:
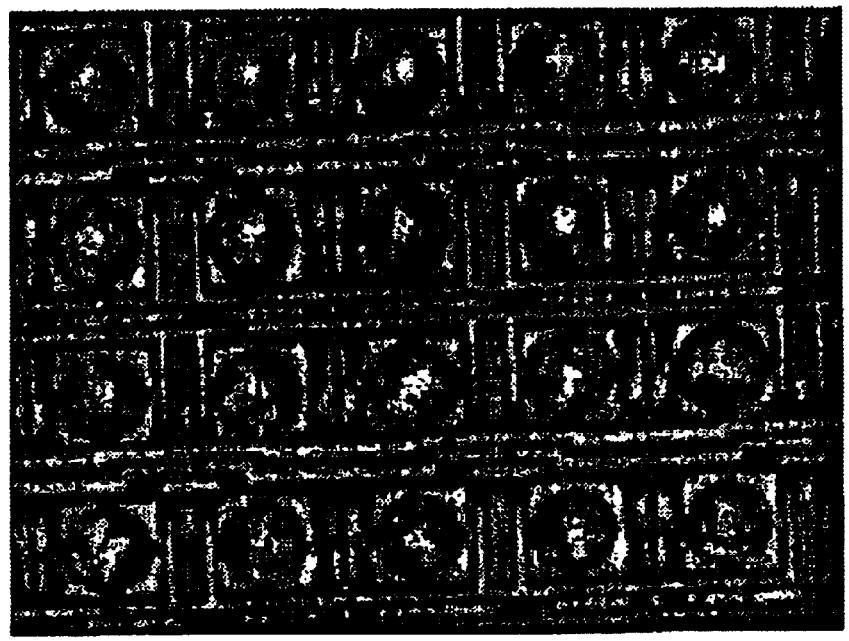

FIGS. 3(a)–3(b) are Litton ROIC.

DETAILED DESCRIPTION OF THE DRAWINGS

The active layers of photovoltaic and photoconductive type-II detectors of the subject invention are made from superlattices with a type-II band alignment which in turn can be formed of binary or ternary alloy systems, as known in the art. Similar to a type-I superlattice, the allowed energy states form the 'minibands', due to the coupling of electrons and holes in adjacent wells. However, unlike type-I superlattices, one can adjust the bandgap of type-II superlattices from a finite value to virtually zero. These superlattices resemble a direct gap semiconductor, since the minimum of the miniband in momentum space is located at the center of the Brilloin zone. Knowing the band structure and the optical absorption process in type-II superlattices, one can use conventional photovoltaic and photoconductive structures to realize high performance type-II detectors.

Type-II photoconductive devices may be grown on GaAs substrate or on InSb, InAs, Si, InP, sapphire or other materials in the $\lambda_c=12$ $\mu$m to $\lambda_c=32$ $\mu$m range operating at 80 K. Unlike HgCdTe, these detectors showed an excellent energy gap uniformity over a three-inch wafer area which is important for imaging applications. A series of high performance photovoltaic type-II superlattice detectors show excellent uniformity in the VLWIR range. The main advantage of photovoltaic detectors is their suitability for staring, two-dimensional focal plane array (FPA) applications, where low current bias circuitry significantly reduces the array power and heat dissipation requirements.

EXAMPLE

A type-II superlattice structure was grown by an Intevac Modular Gem II molecular beam epitaxy equipped with As and Sb valved cracker sources on p-type GaSb substrates. The photodiode structures were grown at 395° C. according to a calibrated pyrometer. First, a 1 $\mu$m GaSb buffer/contact layer doped with Be (p~$1\times10^{18}$ cm$^{-3}$) was deposited. Then, a 0.5 $\mu$m thick InAs/GaSb:Be (p~$1\times10^{18}$ to $3\times10^{17}$ cm$^{-3}$) superlattice was grown followed by a 2 $\mu$m thick nominally undoped superlattice. Finally, a 0.5 $\mu$m thick InAs:Si/GaSb (n~$1\times10^{18}$ cm$^{-3}$) superlattice was grown and capped with a 100 Å thick InAs:Si (n~$2\times10^{18}$ cm$^{-3}$) top contact layer. The growth rate was 0.5 monolayer/s for InAs layers and 0.8 monolayer/s for GaSb layers. The V/III beam-equivalent pressure ratio was about 4 for InAs layers and about 1.2 for GaSb layers. The cracker temperature for As and Sb cells was 800° C. The selected thickness of InAs and GaSb layers were determined for specific cutoff wavelengths using a four-band superlattice k·p model. For devices with nearly a cutoff wavelength of 16 $\mu$m, the thickness of InAs layers was 54 Å and the thickness of the GaSb layers was 40 Å. Other type-II superlattice structures may be similarly grown utilizing the binary systems of SiGe and others. Ternary systems, as in Ga$_x$In$_{1-x}$Sb/InAs and others may also be used.

The infrared FPA fabrication starts with the detector (e.g. type-II superlattice) structure growth, which can be performed by MOCVD or MBE technology. The structure set forth in the Example may be prepared. (FIG. 1(a))

The fabrication of detector pixels includes the UV-photolithography for the sample patterning and the etching (like ECR-RIE dry etching or wet chemical etching) for the pattern transfer. For large format FPAs, the pitch size is usually between 25–40 $\mu$m. The detector pixel size is even smaller. Higher fill factor (ratio of pixel area to unit area) is always pursued for this step. However, the fill factor is basically determined by the photomask and ROIC design requirements. (FIG. 1(b))

For detector pixel passivation, SiO$_2$ or Si$_3$N$_4$ are common passivation materials. Selection of either SiO$_2$ or Si$_3$N$_4$ is determined by the spectral response of the detector (e.g. type-II superlattice) device. The deposition of SiO$_2$ and Si$_3$N$_4$ can be performed by plasma enhanced chemical vapor deposition (PECVD). (FIG. 1(c))

Patterning and etching of the passivation layer makes openings for the metal connection to each detector pixel. The opening size depends on the pixel size. The common bottom contact is generally made at the edge of whole array. To achieve higher indium bump uniformity (see FIG. 1(e)), the bottom contact is usually realized by shortcutting the top contact layer with bottom contact layer at the bottom contact mesa (such as a large square ring around the whole array). In this scheme, all the indium bumps can be made at the same altitude. (FIG. 1(d))

Top and bottom contact metallization can be done by either lift-off or etch back technique. For the detector (e.g. type-II superlattice) device, since the same ohmic contact metal is used for top and bottom contact layer, only one metallization process is required. (FIG. 1(e))

Fabrication of indium bumps serves as electrical interconnection between detector pixels and the ROIC unit cell. Indium was chosen as mating material for most hybrid infrared FPAs due to the fact that it stays ductile even at liquid helium temperature, it is easy to work with and it forms a good bond at atmospheric temperature. Indium bump fabrication may be the most complicated and problematic step during the hybrid FPA fabrication. Two popular indium bump fabrication techniques exist: evaporation (including direct evaporation and lift-off) and electroplating. The uniformity of bump height is a major factor which affects the hybrid FPA's yield. Indium bumps are usually made on both FPA sample and ROIC chip to increase the total bump height. (FIG. 1(f))

Flip-chip bonding of the detector substrate with a Si based ROIC (hybridization) or GaAs, or a InP based ROIC, is usually performed on a flip-chip aligner. The schematic of alignment procedure is shown in FIG. 2. An optical head will be brought between the upper and lower chips. The surface image of both upper chip and lower chip will be displayed on a monitor with the help of two video cameras. The alignment can be done either manually or automatically. After fine alignment and parallelism, the optical head will be removed and the upper and lower chip will be pressed together with preset pressure and temperature. The indium joint needs to be reflowed at a preset temperature within an inert atmosphere. The gap size in between FPA and ROIC is mainly determined by the bonding pressure and total indium bump height before bonding. Any unparallelism between FPA and ROIC surface might reduce the FPA hybrid's performance. However, taller indium bumps can tolerate more unparallelism. (FIG. 1(g))

The readout integrated circuit (ROIC) used in the FPA fabrication of the subject invention is a 256×256 Litton ROIC. The ROIC serves as an electrical interface between the FPA and the external electrical signal processing circuit. Photocurrent from each detector pixel is integrated to a integration capacitor during integration time. The charge on integration capacitor is then transferred to a sample & hold capacitor and read out sequentially. The pitch and pixel size of a Litton ROIC are 30 $\mu$m and 25 $\mu$m respectively. FIG. 3(a) and FIG. 3(b) show two Litton ROIC pictures, FIG. 3(a) being a picture of the corners, and FIG. 3(b) being a picture of a unit cell with indium bumps.

Underfill dispensing between the FPA and the ROIC is usually based on an epoxy system. The underfill provides the necessary mechanical strength to the detector array and readout hybrid prior to the thinning process. It also reduces the effect of global thermal expansion mismatch between the detector array and readout chip and protects the FPA hybrid from moisture, ionic contaminants, and hostile operating environments such as shock and vibration. (FIG. 1(h))

Detector substrate thinning process is usually performed by abrasive polishing or wet chemical etching. In some cases, the substrate is completely removed. The purpose of this step is to further reduce or completely eliminate (for substrate removal) the thermal expansion mismatch between detector array and readout chip. This basically allows the detector (e.g. type-II superlattice) FPAs to go through an unlimited number of temperature cycles without any indium bump breakage or delamination. Furthermore, the substrate thinning process also eliminates the pixel-to-pixel optical cross-talk and significantly enhances the optical coupling of infrared radiation into the detector (e.g. type-II superlattice) pixels. (FIG. 1(i))

In the packaging of the FPA hybrid, the hybrid is bonded onto a lead-free ceramic chip carrier (LCCC) by die-bonding process and Input/Output metal pads on the readout chip are connected to the LCCC pins by a wire-bonding process. (FIG. 1(j))

What is claimed here is:

1. An infrared detector device comprising: a type-II superlattice structure on a Gasb substrate,
    a detector pixel,
    an indium bump contacting said detector pixel on one side,
    and contacting a ROIC unit cell on an opposite side;
    the ROIC unit being bonded to the substrate
    underfill between the substrate and the detector substrate to form a FPA hybrid, the FPA hybrid being connected to a ceramic chip carrier.

2. The infrared detector device of claim 1 the type-II superlattice structure comprises a system selected from the groups consisting of InAs/GaSb; SiGe; InAs/Ga$_x$In$_{1-x}$Sb; and InAs/GaSb/AlSb.

3. The infrared detector device of claim 1 the detector pixel is at least partially passivated.

4. The infrared detector device of claim 3 wherein the detector pixel is at least partially passivated with SiO$_2$ or Si$_3$N$_4$.

5. The infrared detector device of claim 1 wherein the type-II superlattice is a binary system.

6. The infrared detector device of claim 1 wherein the substrate is thinner.

7. The infrared detector device of claim 1 wherein the substrate is 40 mm.

* * * * *

UNITED STATES PATENT AND TRADEMARK OFFICE
CERTIFICATE OF CORRECTION

PATENT NO. : 6,864,552 B2  
APPLICATION NO. : 10/347650  
DATED : March 8, 2005  
INVENTOR(S) : Manijeh Razeghi Page 1 of 1

It is certified that error appears in the above-identified patent and that said Letters Patent is hereby corrected as shown below:

Col. 1, after title insert --This invention was made with Government support under Contract Nos. W15P7T-07-C-M002 awarded by the U.S. Department of the Army and HQ0006-08-C-7848 awarded by the Missile Defense Agency. The Government has certain rights in the invention.--

Signed and Sealed this

Seventh Day of October, 2008

JON W. DUDAS  
*Director of the United States Patent and Trademark Office*

UNITED STATES PATENT AND TRADEMARK OFFICE
CERTIFICATE OF CORRECTION

PATENT NO.       : 6,864,552 B2                                             Page 1 of 1
APPLICATION NO. : 10/347650
DATED            : March 8, 2005
INVENTOR(S)      : Manijeh Razeghi It is certified that error appears in the above-identified patent and that said Letters Patent is hereby corrected as shown below:

On the title page, after the Title: line 5

Please remove "This invention was made with Government support under Contract Nos. W15P7T-07-C-M002 awarded by the U.S. Department of the Army and HQ0006-08-C-7848 awarded by the Missile Defense Agency. The Government has certain rights in the invention."

Signed and Sealed this

Twenty-third Day of December, 2008

JON W. DUDAS
*Director of the United States Patent and Trademark Office*